United States Patent
Tews et al.

(10) Patent No.: US 6,372,567 B1
(45) Date of Patent: Apr. 16, 2002

(54) CONTROL OF OXIDE THICKNESS IN VERTICAL TRANSISTOR STRUCTURES

(75) Inventors: Helmut Horst Tews, Poughkeepsie; Brian S. Lee, New York, both of NY (US); Ulrike Gruening, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/553,708

(22) Filed: Apr. 20, 2000

(51) Int. Cl.$^7$ .......................................... H01L 21/8238
(52) U.S. Cl. ....................... 438/212; 438/149; 438/210; 438/244; 156/643
(58) Field of Search ................................ 438/212, 149, 438/244, 210; 156/643

(56) References Cited

U.S. PATENT DOCUMENTS

| | | | |
|---|---|---|---|
| 4,784,720 A | * 11/1988 | Douglas | 156/643 |
| 4,855,017 A | * 8/1989 | Douglas | 156/643 |
| 4,942,554 A | 7/1990 | Kircher et al. | 365/149 |
| 5,026,659 A | 6/1991 | Lee | 437/52 |
| 5,183,775 A | 2/1993 | Levy | 437/60 |
| 5,935,874 A | 8/1999 | Kennard | 438/710 |
| 6,177,299 B1 | * 1/2001 | Hsu et al. | 438/149 |
| 6,228,706 B1 | * 5/2001 | Horak et al. | 438/244 |

* cited by examiner

Primary Examiner—Vu A. Le
Assistant Examiner—Pho Luu

(57) ABSTRACT

Improved process for preparing vertical transistor structures in DRAMs, in which the trench top oxide separates the bottom storage capacitor from the switching transistor, and in which the upper part of the trench contains the vertical transistor at its side wall, to obtain homogeneous gate oxidation at all different crystal planes inside the trench so that homogeneous thickness is independent of crystal orientation comprising:

a) subjecting a wafer trench side wall to ion bombardment for a period sufficient to generate an amorphous layer of oxide side wall; and b) heating the wafer resulting from step (a) in an oxidizing atmosphere to cause oxidation and recrystallization of the amorphous layer.

9 Claims, 3 Drawing Sheets

CONTROL OF OXIDE THICKNESS IN VERTICAL TRANSISTOR STRUCTURES

BACKGROUND OF THE INVENTION

1. Field of the Invention

The invention relates to a process for providing oxide thickness control in vertical transistor structures used in DRAMs (dynamic random access memory) that require gate oxides with optimum oxide thickness, wherein, at the same time, planar transistors present on the driver and support circuits on the DRAM chips need oxides that are also optimized in accordance with driver and support circuit needs.

2. Description of Related Art

DRAM memory chip area optimization requires incorporation of the transistor into the capacitor trench side wall. This optimization technology reduces the required chip size. Nevertheless, the gate of the array transistor must me placed simultaneously on different crystal planes inside of the trench side wall, and it has been found that the gate oxide thickness is strongly affected by the crystal orientation.

Therefore, the problems confronted by DRAM memory chip area optimization to incorporate the transistor into the capacitor trench side wall, wherein the process normally entails a reduction in the required chip size is: that the thickness of the oxide layer on the vertical side wall is usually thicker in relation to the oxidation (oxide layer) on the wafer surface; and the oxidation rate is dependent upon the crystal orientation of planes on the trench side wall.

U.S. Pat. No. 5,183,775 discloses a method for forming a capacitor in a trench of a semiconductor wafer by implantation of trench surfaces with oxygen. The process entails: selectively implanting oxygen through the bottom surface of the trench into the region of the wafer adjacent the bottom surface of the trench and through the surfaces at the top corners of the trench into regions of the wafer adjacent the surfaces at the top corners of the trench using a plasma formed in a plasma-assisted etching apparatus while maintaining a high negative DC bias on the wafer being implanted. Subsequent growth of oxide on the surfaces of the trench causes the implanted oxygen to form additional oxide in the implanted regions of the wafer adjacent the bottom surface of the trench and adjacent the surface at the top corners of the trench to compensate for the lower oxide growth rates in these areas.

A process for fabricating stacked trench capacitors of dynamic ram is disclosed in U.S. Pat. No. 5,026,659. The process entails: forming trenches between transistor gate electrodes and growing a thermal oxide film for preventing current leakage through side walls of the trench; ion implanting a bottom of the trench with dopants of an opposite conductivity type to those of a transistor source or drain gradient for preventing current leakage through the trench bottom; forming a side-spacer silicon layer on a side wall of the trench by depositing a first silicon layer thereon and performing an anisotropic reactive ion etch on the side-spacer silicon layer; performing wet etch on the thermal oxide film which is unprotected by the side-spacer silicon layer and then depositing a subsequent silicon layer for a storage node of the capacitor; and forming a dielectric layer and capacitor plate.

U.S. Pat. No. 4,942,554 disclose a three-dimensional, one-transistor cell arrangement for dynamic semiconductor memories comprising a trench capacitor and a method of manufacturing the same. The capacitor for the charges to be stored is created as a trench capacitor in the substrate. The first electrode is formed by the substrate and the second electrode that stores the charges is formed by doped polycrystalline silicon that fills the trench. The capacitor, separated by an insulating layer, is arranged under the field effect transistor (selection transistor). An insulated gate electrode (transfer electrode/word line) that lies at the surface of the substrate, is arranged having source/drain zones generated in the recrystallized silicon layer applied on the insulating layer and is connected to the source/drain zones thereof via an electrically conductive contact.

A method for forming trenches in a silicon layer of a substrate in high-density plasma processing system is disclosed in U.S. Pat. No. 5,935,874. The plasma processing system has a variable plasma generation source and a variable ion energy source with the variable plasma generation source being configured to be controlled independently of the variable ion energy source. The method further includes flowing an etchant source gas that includes $O_2$, helium, and at least one of $SF_6$ and $NF_3$ into the plasma-processing chamber. There is also included energizing both the variable plasma generation source and the variable ion energy source to form a plasma from the etchant source gas. Additionally, there is included employing the plasma to etch the trench.

In the formation of DRAM memory chip area optimization that requires the incorporation of the transistor into the capacitor trench side wall, and wherein this process reduces the required chip size, and wherein the gate of the array transistor must be placed simultaneously on different crystal planes inside the trench side wall, there is a need to resolve the problem where the thickness of the oxide layer on the vertical side wall is thicker in comparison to the oxidation (oxide layer) on the wafer surface and to resolve the problem due to the fact that the oxidation rate depends on the crystal orientation of planes on the trench side wall.

SUMMARY OF THE INVENTION

One object of the present invention is to provide a process to over come the fact that the thickness of an oxide layer on a vertical side wall is thicker compared to the thickness of oxide layers on the wafer surface upon incorporation of a transistor into the capacitor trench side wall, upon preparation of vertical transistor structures in DRAMs.

A further object of the present invention is to provide a process to over come the fact that the oxidation rate depends upon the crystal orientation of planes on the trench side wall in preparing vertical transistor structures in DRAMs.

A yet further object of the present invention is to provide an integrated or combined process innovation scheme when preparing vertical transistor structures in DRAMs to control oxide thickness in vertical transistor structures in DRAMs to obtain homogeneously thick oxides of the required target thickness on the trench side wall at all different crystal planes inside the trench.

In general, the invention is accomplished by: using a plasma to effect amorphization of the capacitor trench side walls followed by thermal oxidation to obtain homogenous gate oxidation at all different crystal planes inside the trench. Plasma ion implantation (PLAD) is used to create a uniform, very thin amorphous layer at the vertical trench side wall by ion bombardment and subjecting the formed amorphous layer to heat in an oxidizing atmosphere to affect oxidation and recrystallization of the amorphous layer.

DESCRIPTION OF THE PREFERRED EMBODIMENTS

While DRAM memory chip area optimization requires the incorporation of the transistor into the capacitor side trench walls, this optimization requirement results in the reduction of the requirements for the chip size. Also, during the preparation of vertical transistor structures in DRAMs, the gate of the array transistor must be placed simultaneously on different crystal planes inside of the capacitor trench side wall; however, it is a technological draw back that the gate oxide thickness is significantly effected by the crystal orientation in the trench side wall.

Further, although vertical transistor structures in DRAMs require gate oxides with optimum oxide thickness, at the same time, the planar transistors present on driver and support circuits on DRAM chips require oxides optimized based upon the needs of the driver and support circuits.

The present invention has devised a process integration scheme that provides homogeneously thick oxides of the required target thickness on the trench side walls in vertical transistor structures in DRAMs. The process integration scheme requires: preparing the DT (deep trench) etch and fabrication of the storage capacitor in prior art known ways; preparing a trench top oxide to separate the storage capacitor from the switching transistor; cleaning of the top part of the trench; amorphization of the trench side wall by ion bombardment; and heat treating the ion bombarded side wall in an oxidizing atmosphere.

Figure 1:
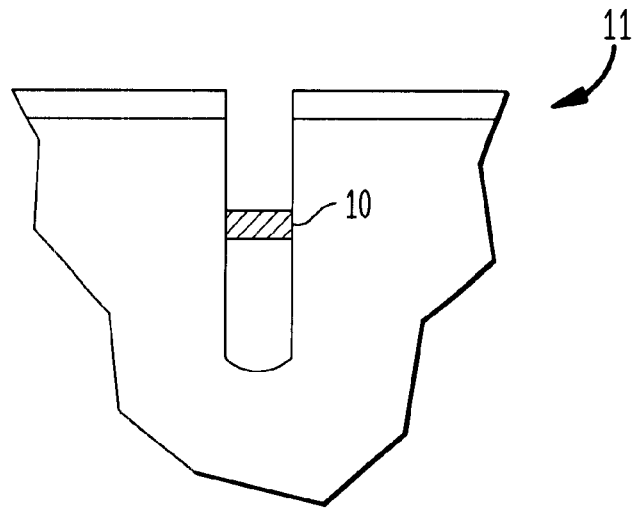
FIG. 1 shows a prior art trench structure in which the bottom part contains a storage capacitor that is covered by an insulating top oxide that separates the storage capacitor from the switching transistor, and in which the upper part of the trench must contain the vertical transistor at its side wall.

Reference is made to FIG. 1, which shows a trench structure in which the bottom part contains the storage capacitor covered by an insulating trench top oxide 10. A hard mask 11 is shown in its known location, and the upper part of the trench must contain the vertical transistor at its side wall.

The integration scheme of the invention process for controlling oxide thickness in vertical transistor structures uses plasma amorphization of trench side walls followed by thermal oxidation to obtain homogeneous gate oxidation at all different crystal planes inside the trench.

Figure 2:
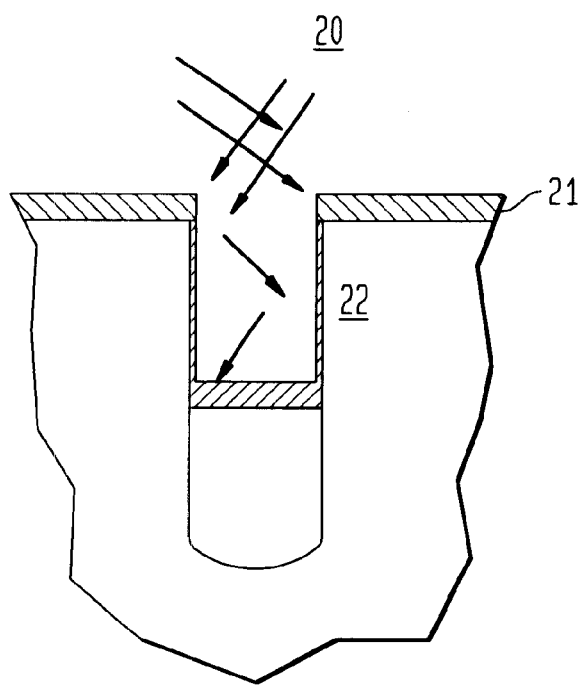
FIG. 2 is a schematic of a trench side wall showing ion bombardment of the trench side wall to generate to a thin amorphous layer.

As shown in FIG. 2, ion bombardment, specifically plasma ion implantation (PLAD) 20 of the trench side wall is utilized beyond the pad nitride 21 but on the trench side wall to generate a uniform, very thin, amorphous layer. In this connection, the ion species can be Si. The thin amorphous layer has no influence on the crystal orientation of the underlying Si crystal. However, two effects occur when the wafer is subjected to heating in an oxidizing atmosphere subsequent to ion bombardment; namely: 1) the amorphous layer is oxidized; and 2) the amorphous layer recrystallizes. Depending upon the thermal conditions utilized, a significant part of the amorphous layer is oxidized before recrystallization occurs.

In the case of PLAD amorphization, the thickness of the amorphous layer is independent of the crystal orientation in the trench. Therefore, any dependence of the thermal oxidation on crystal orientation is substantially reduced.

Figure 3:
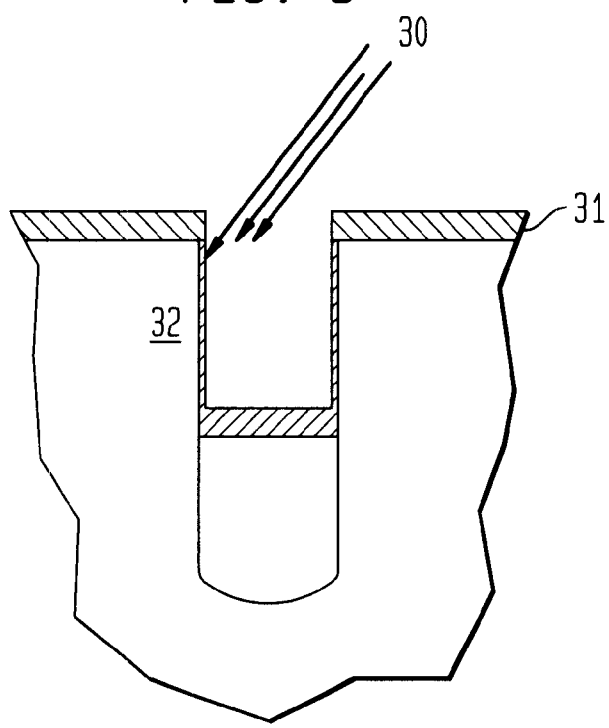
FIG. 3 shows a schematic of a trench side wall using an alternate embodiment of invention in which angled ion implantation is utilized to achieve amorphization of the trench side wall.

When it is sought to locally amorphize the Si side wall in the trench, when using ion beam implantation, tilted or angled implantation such as dual or quad implantation may be used. FIG. 3 shows a schematic in which angled ion implantation 30 is directed past the pad nitride 31 to create the amorphous layer 32.

Figure 4:
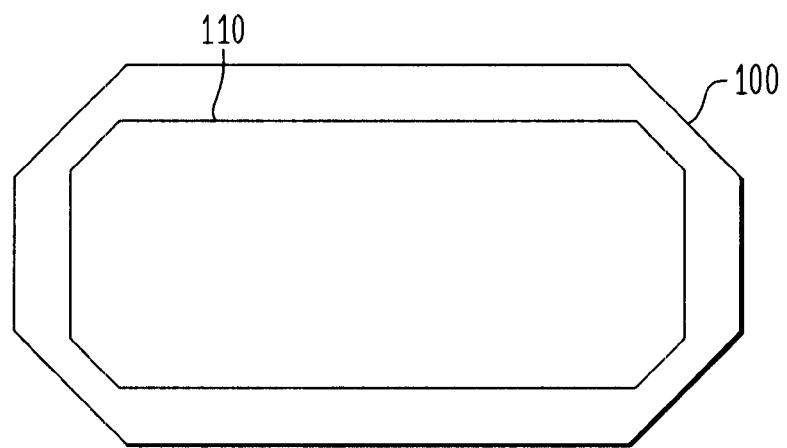
FIG. 4 depicts a top view of a trench in which there is an equally thick or homogeneous dielectric at the side walls that is independent of crystal orientation as a result of subjecting the capacitor trench side walls to ion bombardment followed by thermal treatment in an oxidizing atmosphere.

As may be seen from FIG. 4, the typical thermal oxide thickness is dependent upon crystal plane orientation as the oxide layer from the top view of a trench is uneven in thickness when crystal planes of 100 and 110 are contrasted, prior to subjecting the wafer trench side wall to ion bombardment followed by heating in an oxidizing atmosphere.

Figure 5:
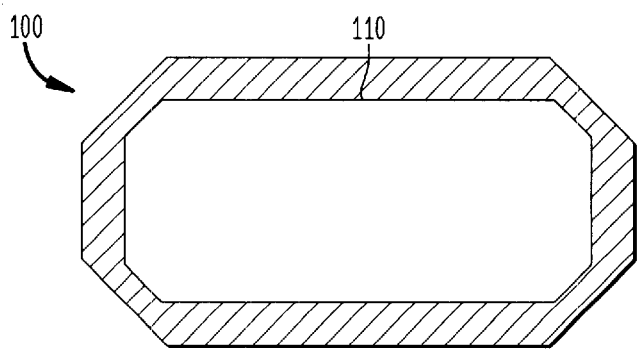
FIG. 5 is a top view of a trench in which there is uneven thickness of the oxide layer prior to subjecting the wafer trench side wall to ion bombardment followed by heating in an oxidizing atmosphere to cause oxidation and recrystallization of the amorphous layer.

The top view of the capacitor side trench walls in FIG. 5 shows that the trench wall is characterized by an equally thick sacrificial dielectric regardless of the fact that the crystal planes are different inside the trench side wall; thereby showing that the dependence of the thermal oxidation on crystal orientation is substantially reduced or eliminated as a result of the combination plasma amorphization and thermal oxidation treatment process to obtain homogeneous gate oxidation at all different crystal planes inside the trench.

Figure 6:
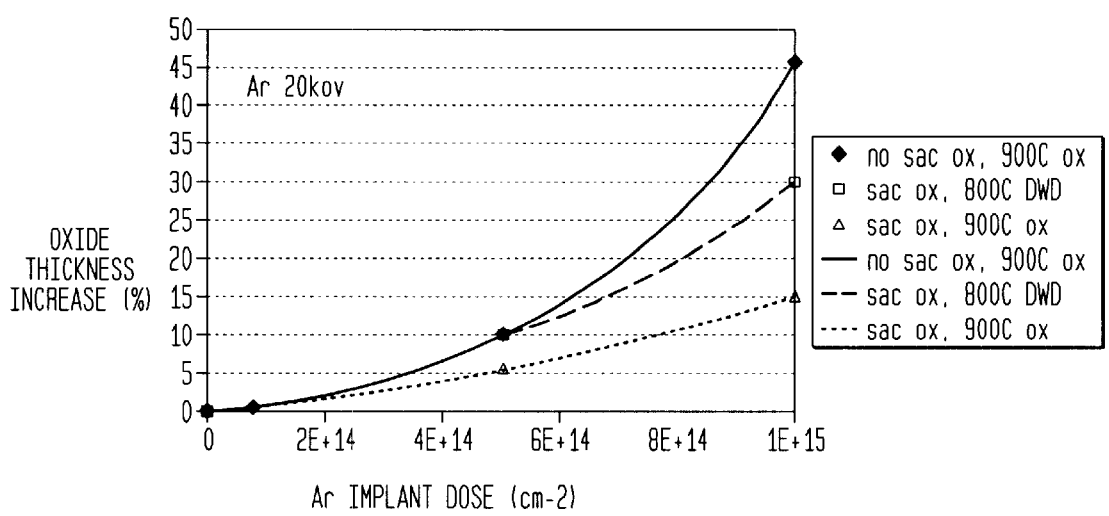
FIG. 6 is a graph in which Ar implantation is used, and shows oxide thickness increase percent versus the Ar implant dose ($cm^{-2}$).

FIG. 6 is a graph depicting oxidation enhancement using Ar. The graph compares oxide thickness increase percent versus Ar implant dosage ($cm^{-2}$). These are planar wafer results for different oxidation recipes (800° C. and 900° C. oxidation), and for the two cases of no sacrificial oxide and with sacrificial oxide. The oxidation enhancement using Ar is due to amorphization, and oxidation occurs prior to complete recrystallization. The required argon implant dose is between 1e14–1e15 $cm^{-2}$.

In the context of the invention, when utilizing ion bombardment or implantation, the implant energy may generally range from about 5 keV to about 25 keV. However, when utilizing plasma implantation, the implant energy may be lower or between about 2 KeV to about 10 KeV.

The oxidation step in which the wafer is subjected to heating may be conducted at a wide temperature range; however, in the instance where furnace oxidation is utilized, the range of temperatures will be from about 700 to about 900° C. and the oxidation times will vary from between about 5 to about 30 minutes, depending upon the temperature selected. When rapid thermal processing (RTP) is utilized, the heating temperature ranges may be from about 900 to about 1100° C. and the oxidation times will generally be shorter or vary from about 1 to about 30 seconds.

While a range of amorphizing species may be used to affect implantation, the preferred amorphizing species are Ar and Si. When Ar is the amorphizing species the invention will utilize a dose of between about 1e14–2e15 $cm^{-2}$.

While the Examples herein are directed to only a few of the many variables included in the invention process of using a plasma to effect amorphization of capacitor trench side walls followed by thermal oxidation to obtain homogeneous gate oxidation at all different crystal planes inside the trench in a vertical transistor structure, it is to be understood that the embodiments presented are illustrative and not restrictive, and the invention is not to be limited to the details given, but may be modified within the scope of the appended claims.

What is claimed is:

1. In a process for preparing vertical transistor structures in DRAMs, in which the trench top oxide separates the bottom storage capacitor from the switching transistor, and in which the upper part of the trench contains the vertical transistor at its side wall, the improvement of obtaining homogeneous gate oxidation at all different crystal planes inside the trench so that homogeneous thickness is independent of crystal orientation comprising:

a) subjecting a wafer trench side wall to ion bombardment with an amorphizing species for a period sufficient to generate a uniform amorphous layer in said side wall; and b) heating the wafer resulting from step (a) in an oxidizing atmosphere to cause said uniform amorphous layer to be oxidized and recrystallized.

2. The process of claim 1 wherein said ion bombardment causes ion beam implantation.

3. The process of claim 2 wherein said ion beam implantation is tilted angled implantation.

4. The process of claim 3 wherein said tilted angled implantation is dual implantation.

5. The process of claim 3 wherein said tilted angled implantation is quad implantation.

6. The process of claim 3 wherein said titled angled implantation is used to locally amorphize the side wall.

7. The process of claim 6 wherein said side wall is Si.

8. The process of claim 1 wherein said ion bombardment is plasma ion implantation (PLAD).

9. The process of claim 1 wherein said ion bombardment is effected with an amorphizing species selected from the group consisting of Ar and Si.

* * * * *